US012793585B2

(12) United States Patent
Park et al.

(10) Patent No.: US 12,793,585 B2
(45) Date of Patent: Nov. 10, 2026

(54) DISPLAY SUBSTRATE AND DISPLAY DEVICE COMPRISING SAME

(71) Applicant: LG INNOTEK CO., LTD., Seoul (KR)

(72) Inventors: Duck Hoon Park, Seoul (KR); Hae Sik Kim, Seoul (KR); Jee Heum Paik, Seoul (KR); Sung Won Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 57 days.

(21) Appl. No.: 18/928,969

(22) Filed: Oct. 28, 2024

(65) Prior Publication Data

US 2025/0054418 A1 Feb. 13, 2025

Related U.S. Application Data

(63) Continuation of application No. 17/629,458, filed as application No. PCT/KR2020/009587 on Jul. 21, 2020, now Pat. No. 12,159,557.

(30) Foreign Application Priority Data

Jul. 29, 2019 (KR) ........................ 10-2019-0091609
Aug. 13, 2019 (KR) ........................ 10-2019-0098883

(51) Int. Cl.
*G09F 9/30* (2006.01)
*H10K 59/12* (2023.01)
*H10K 77/00* (2023.01)

(52) U.S. Cl.
CPC ............. *G09F 9/301* (2013.01); *H10K 59/12* (2023.02); *H10K 77/00* (2023.02)

(58) Field of Classification Search
CPC ...... H10K 77/00; H10K 59/12; H10K 77/111; G02F 1/133305; G06F 1/1616;
(Continued)

(56) References Cited

U.S. PATENT DOCUMENTS 8,164,252 B2 4/2012 Lee et al.
9,947,882 B2 * 4/2018 Zhang .................. G06F 1/1616
(Continued)

FOREIGN PATENT DOCUMENTS

CN 106252378 12/2016
CN 205881905 1/2017
(Continued)

OTHER PUBLICATIONS

International Search Report dated Nov. 6, 2020 issued in Application No. PCT/KR2020/009587.
(Continued)

*Primary Examiner* — Allen L Parker
*Assistant Examiner* — Martin Antonio Asmat Uceda
(74) *Attorney, Agent, or Firm* — KED & ASSOCIATES, LLP

(57) ABSTRACT

A display substrate according to an embodiment relates to a display substrate comprising a display panel installation area and a bezel area. The display substrate comprises one surface and the other surface opposite to the one surface, and the display substrate comprises: a first area which is defined as a folding area; and a second area which is defined as an unfolding area, wherein a groove is formed on the one surface or the other surface of the display substrate and formed in the display panel installation area of the first area, and a hole is formed through the one surface and the other surface of the display substrate and formed in the bezel area of the first area.

19 Claims, 8 Drawing Sheets

(58) Field of Classification Search
CPC .... G06F 1/1641; G06F 1/1652; G06F 1/1656; G06F 2203/04102; H04M 1/0216; G09F 9/301
See application file for complete search history.

(56) References Cited

U.S. PATENT DOCUMENTS

| | | | |
|---|---|---|---|
| 9,983,424 | B2 | 5/2018 | Kim et al. |
| 10,020,462 | B1 * | 7/2018 | Ai ........................ H10K 59/871 |
| 10,056,443 | B2 * | 8/2018 | Shyu .................. H10K 59/8721 |
| 10,074,824 | B2 * | 9/2018 | Han ........................ H10K 59/87 |
| 10,077,206 | B2 | 9/2018 | Castle et al. |
| 10,164,208 | B2 | 12/2018 | Lee et al. |
| 10,170,505 | B2 | 1/2019 | Lee et al. |
| 10,375,839 | B2 | 8/2019 | Jung et al. |
| 10,381,581 | B2 | 8/2019 | Jeong et al. |
| 10,485,116 | B2 | 11/2019 | Kim |
| 10,558,242 | B2 | 2/2020 | Kim et al. |
| 10,579,103 | B2 | 3/2020 | Kim et al. |
| 10,608,024 | B2 | 3/2020 | Lee et al. |
| 10,665,823 | B2 | 5/2020 | Kim et al. |
| 10,734,612 | B2 * | 8/2020 | Wu .......................... G02B 1/14 |
| 10,833,106 | B2 * | 11/2020 | Ke ..................... H10D 86/0212 |
| 10,897,826 | B2 | 1/2021 | Jung et al. |
| 10,930,883 | B2 * | 2/2021 | Park ...................... G06F 1/1641 |
| 11,031,563 | B1 * | 6/2021 | Li ........................ H10K 77/111 |
| 11,243,564 | B2 * | 2/2022 | Kim ...................... G06F 1/1616 |
| 2010/0007271 | A1 | 1/2010 | Lee et al. |
| 2015/0049428 | A1 | 2/2015 | Lee et al. |
| 2015/0102327 | A1 | 4/2015 | Kim et al. |
| 2016/0357052 | A1 | 12/2016 | Kim et al. |
| 2017/0054106 | A1 | 2/2017 | Jeon |
| 2017/0064845 | A1 | 3/2017 | Jung et al. |
| 2017/0352692 | A1 | 12/2017 | Lee et al. |
| 2018/0097197 | A1 | 4/2018 | Han et al. |
| 2018/0190936 | A1 | 7/2018 | Lee |
| 2019/0172855 | A1 | 6/2019 | Lee et al. |
| 2019/0196548 | A1 | 6/2019 | Kim |
| 2019/0200466 | A1 | 6/2019 | Kim |
| 2019/0334114 | A1 | 10/2019 | Park |
| 2019/0350092 | A1 | 11/2019 | Jung et al. |

FOREIGN PATENT DOCUMENTS

| | | | |
|---|---|---|---|
| CN | 107464800 | | 12/2017 |
| EP | 2144292 | | 1/2010 |
| EP | 3136158 | | 3/2017 |
| KR | 10-2007-0001717 | | 1/2007 |
| KR | 10-2015-0021167 | A | 3/2015 |
| KR | 10-2016-0144912 | | 12/2016 |
| KR | 10-2017-0137260 | | 12/2017 |
| KR | 10-2018-0017089 | | 2/2018 |
| KR | 10-2018-0034780 | | 4/2018 |
| KR | 10-2018-0036904 | | 4/2018 |
| KR | 10-2018-0040766 | | 4/2018 |
| KR | 10-2018-0061879 | | 6/2018 |
| KR | 10-2018-0079091 | A | 7/2018 |
| KR | 10-2019-0003257 | | 1/2019 |
| KR | 10-2019-0048766 | | 5/2019 |
| KR | 10-2019-0078994 | A | 7/2019 |
| KR | 10-2019-0078997 | | 7/2019 |

OTHER PUBLICATIONS

Chinese Office Action dated Jun. 3, 2023 issued in Application No. 202080054681.3.

Korean Office Action dated Nov. 23, 2023 issued in Application No. 10-2019-0098883.

Korean Office Action dated Mar. 21, 2024 issued in Application 10-2019-01091609.

U.S. Office Action dated Dec. 4, 2023 issued in U.S. Appl. No. 17/629,458.

U.S. Office Action dated May 6, 2024 issued in U.S. Appl. No. 17/629,458.

U.S. Office Action dated Aug. 2, 2024 issued in U.S. Appl. No. 17/629,458.

* cited by examiner

【FIG. 1】
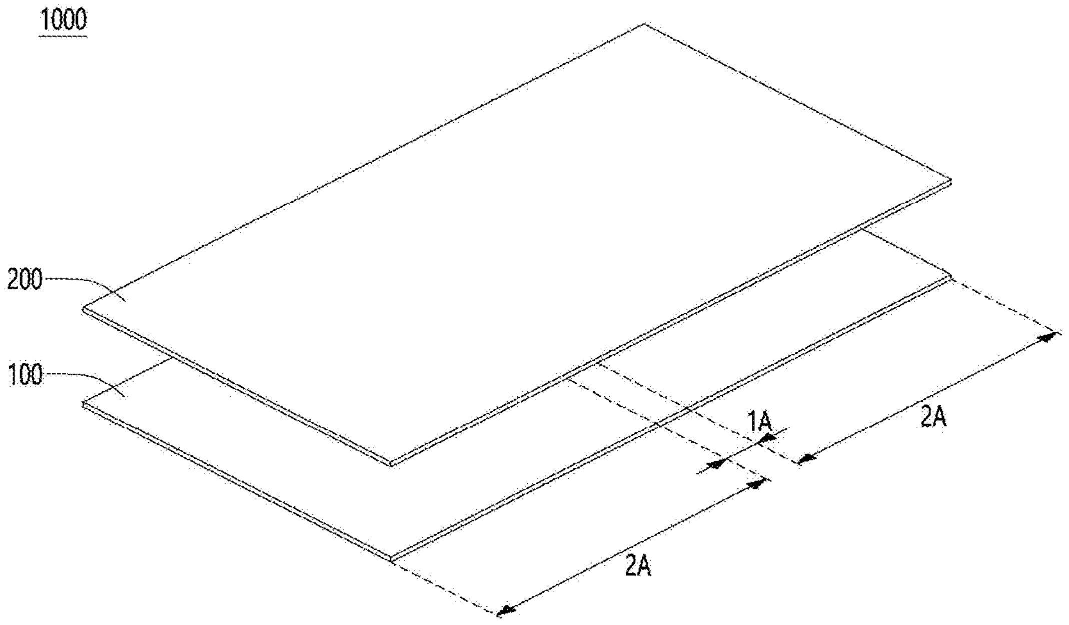
【FIG. 2】
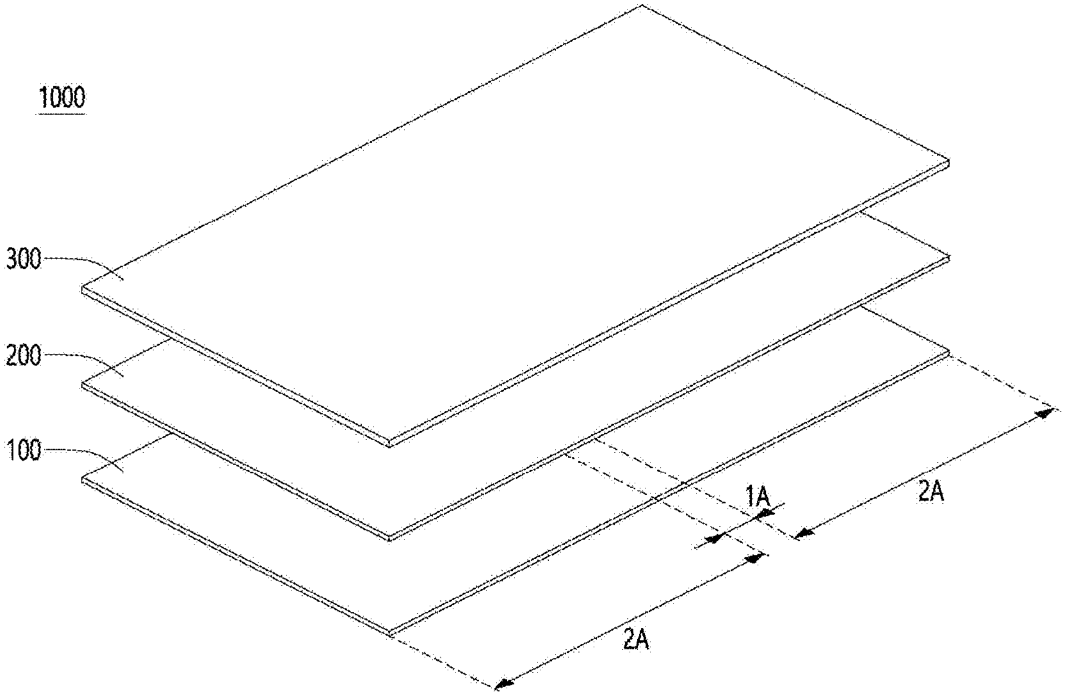

【FIG. 3】
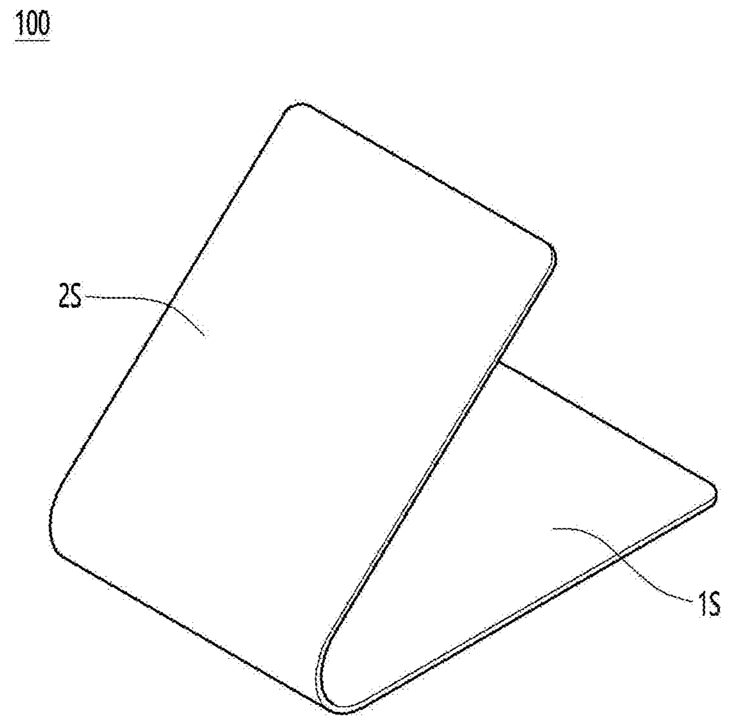
【FIG. 4】
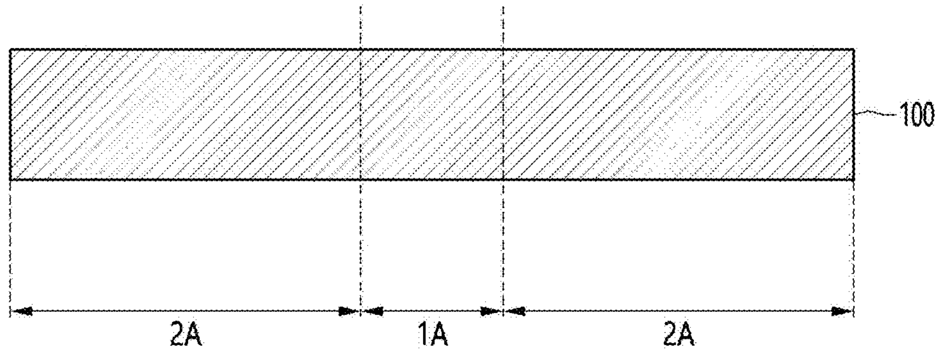

【FIG. 5】
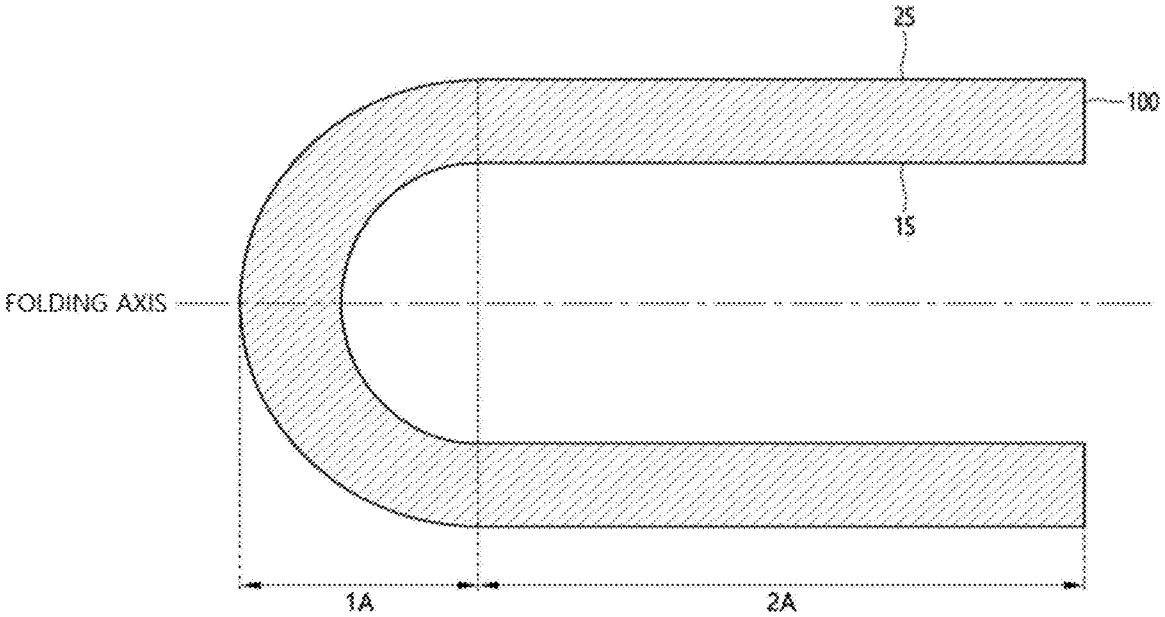
【FIG. 6】
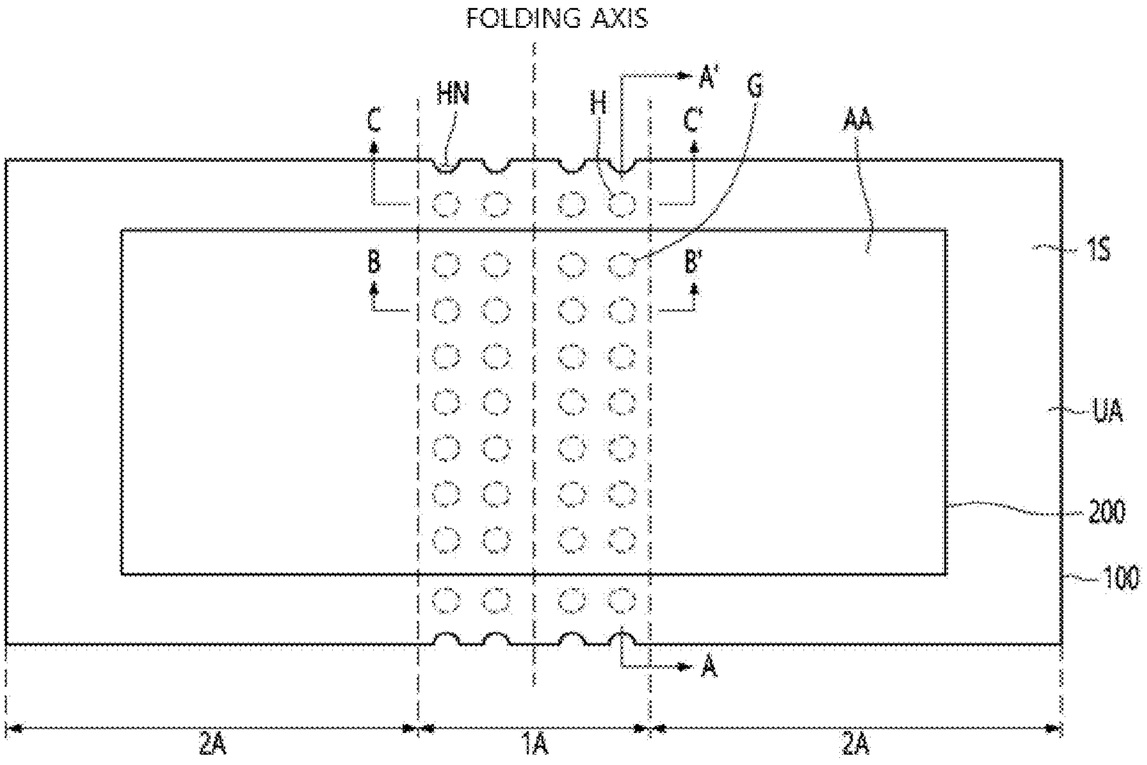

【FIG. 7】
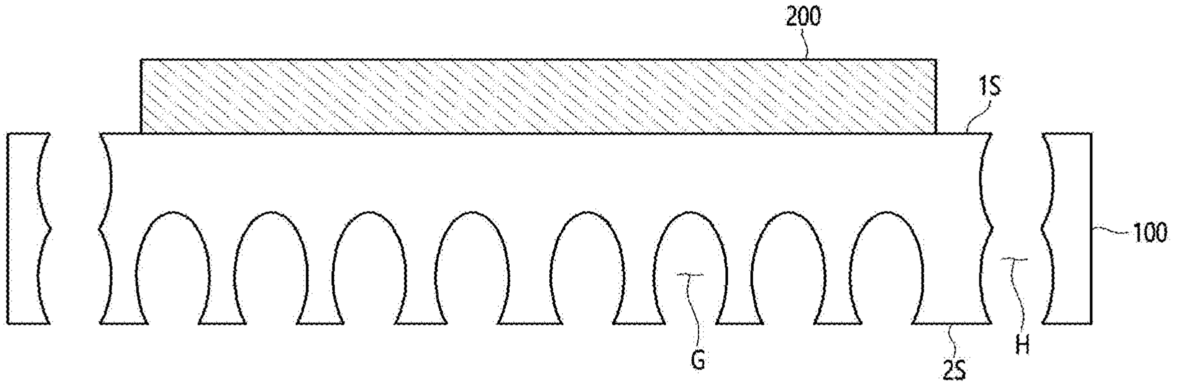
【FIG. 8】
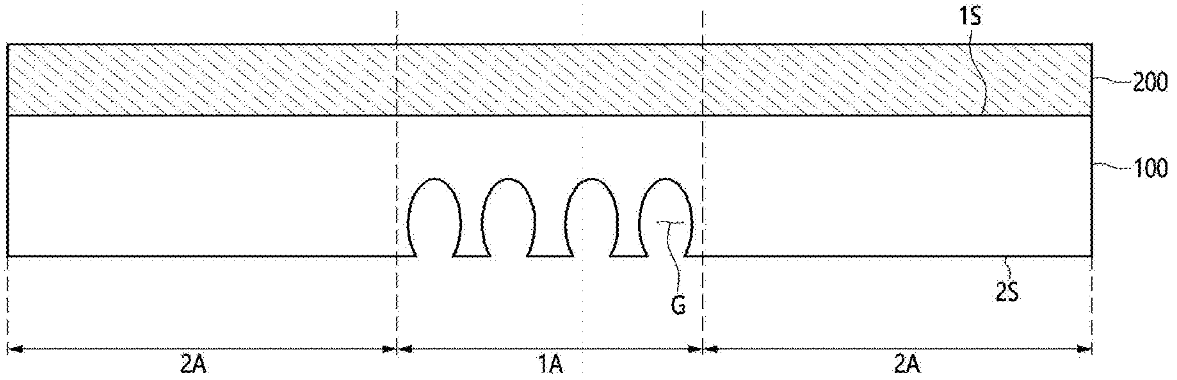
【FIG. 9】
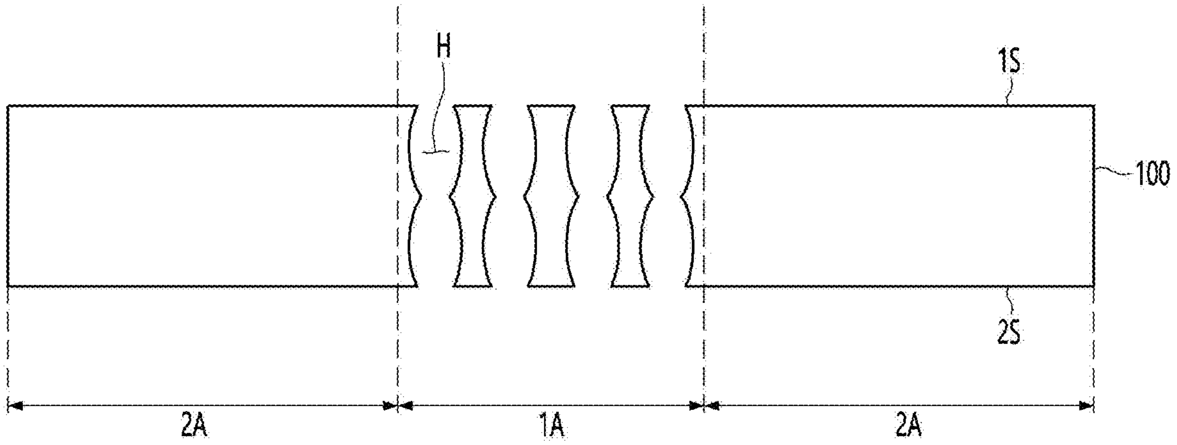

【FIG. 10】
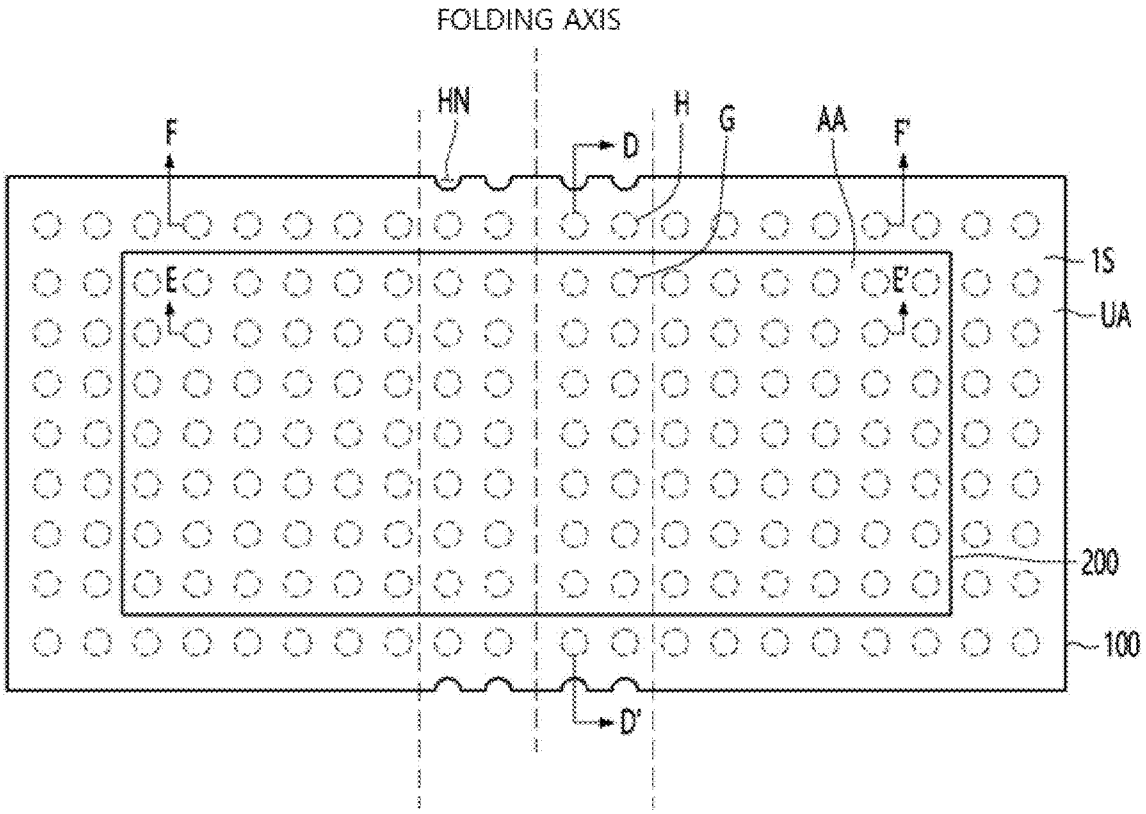
【FIG. 11】
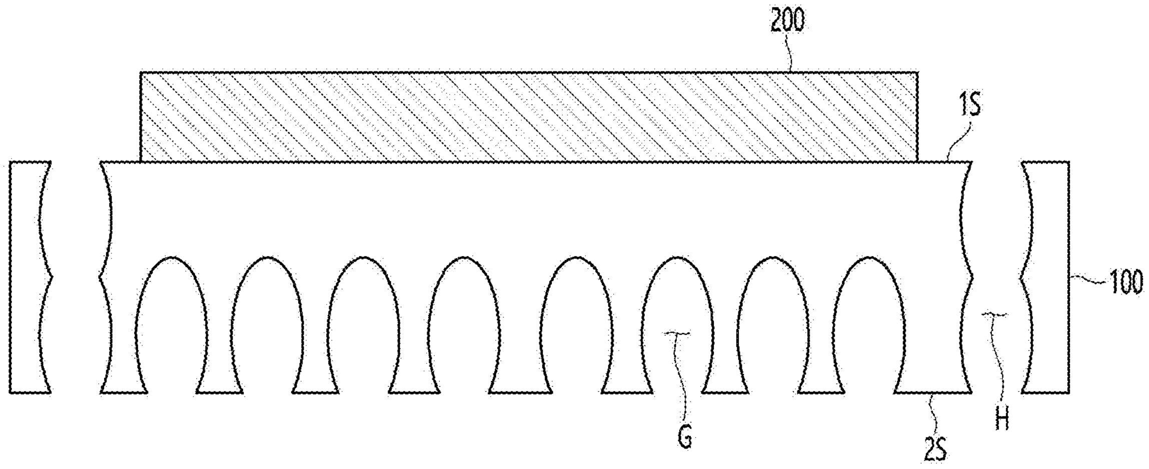

【FIG. 12】
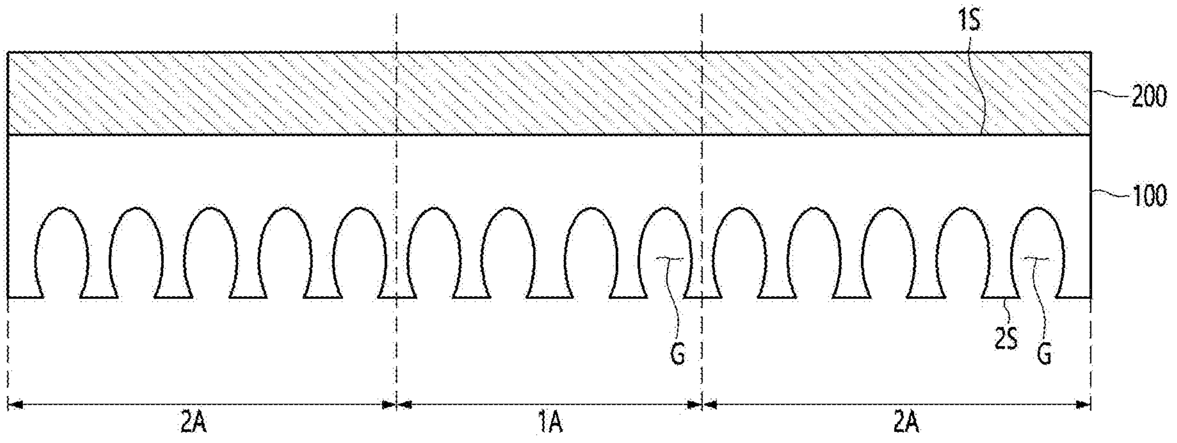
【FIG. 13】
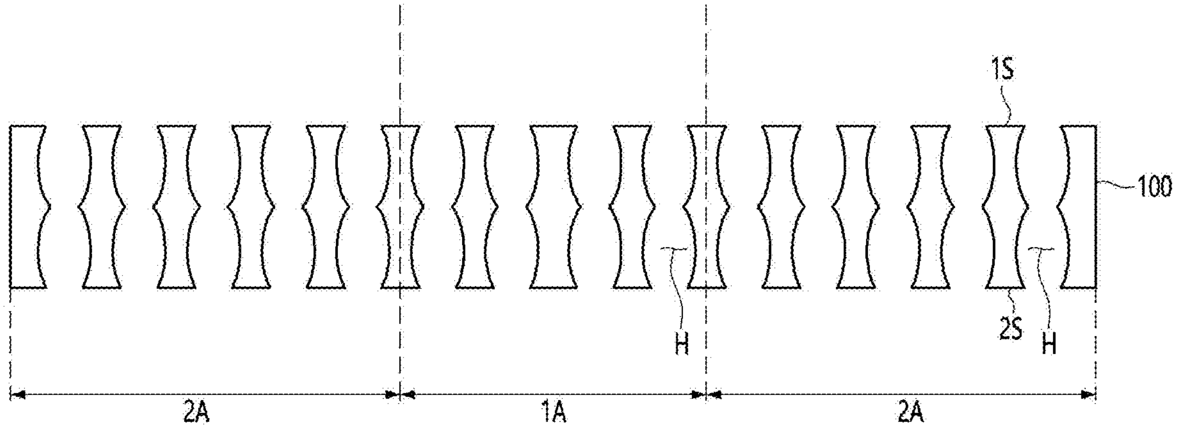
【FIG. 14】
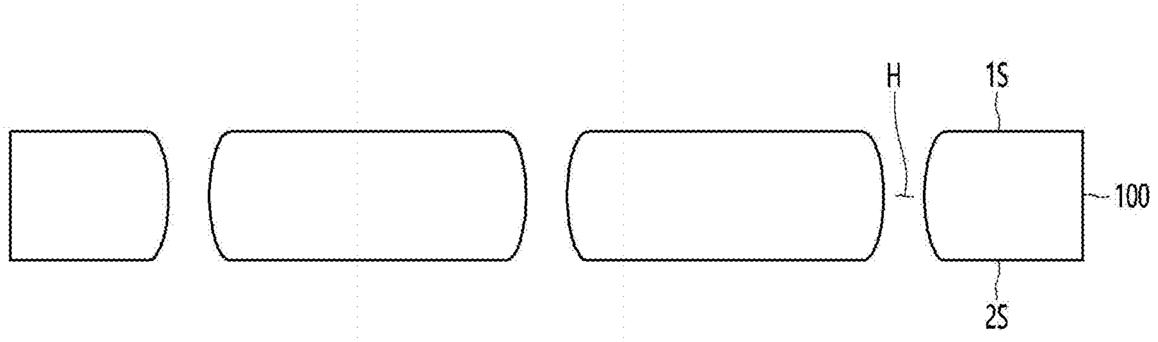

【FIG. 15】
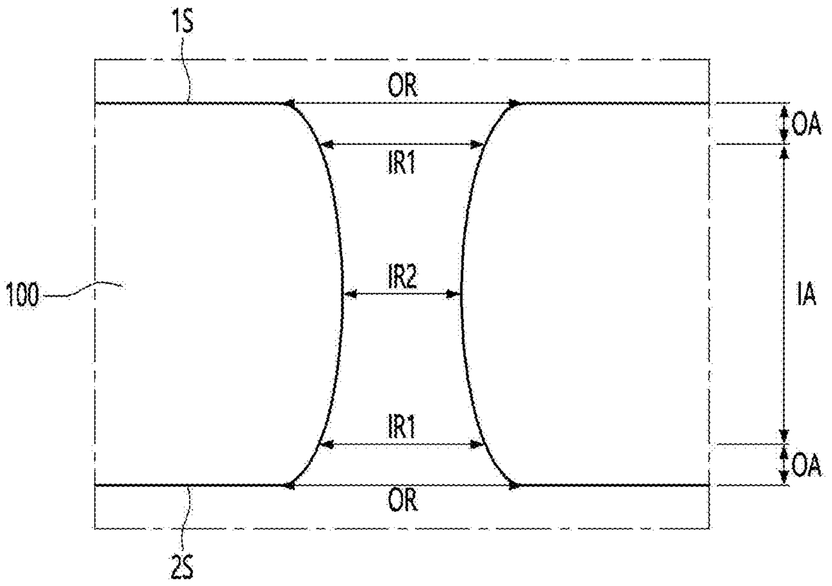
【FIG. 16】
【FIG. 17】
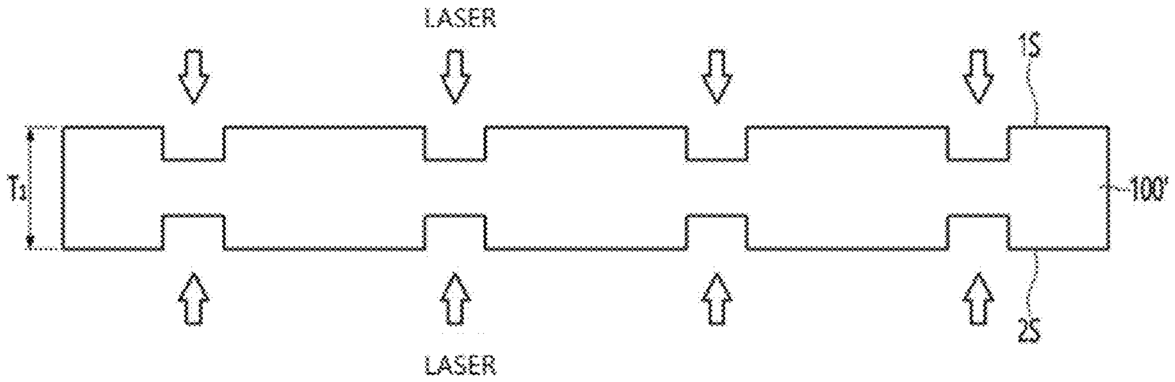

【FIG. 18】
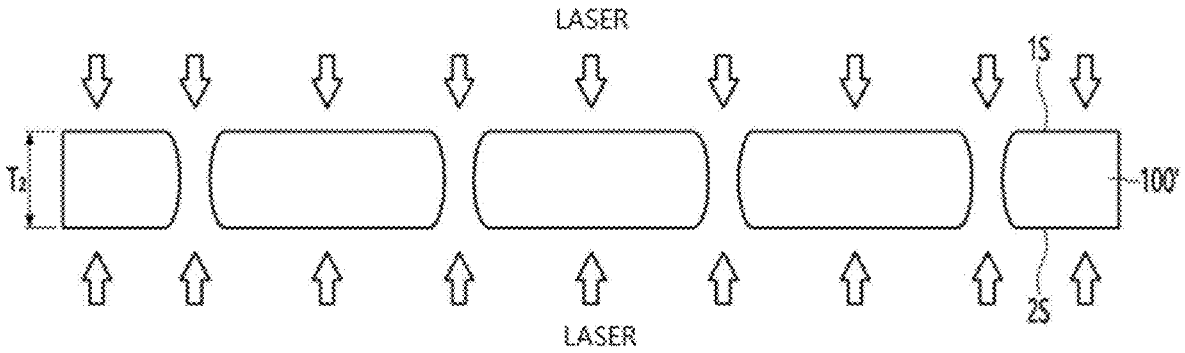
【FIG. 19】
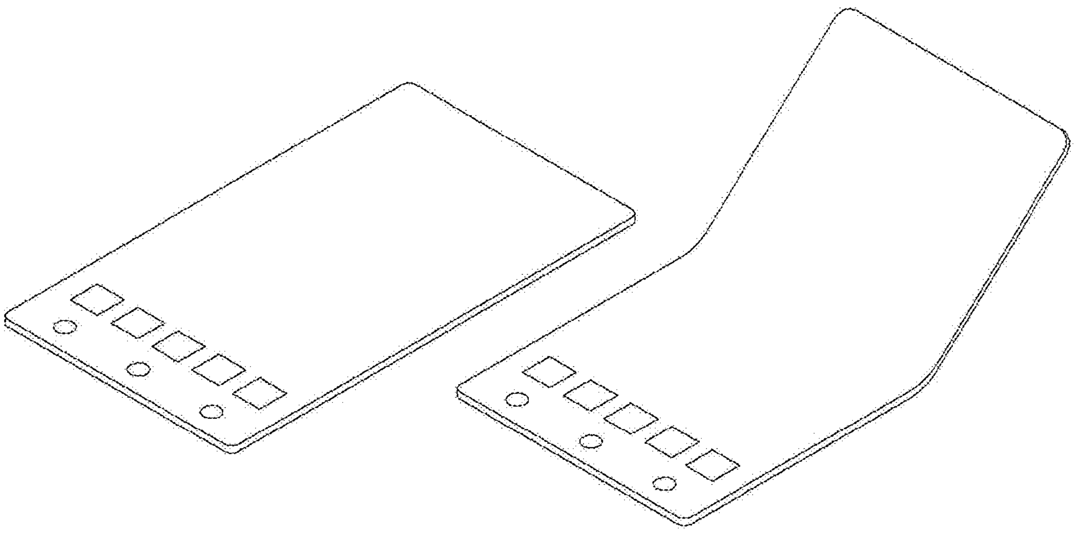

DISPLAY SUBSTRATE AND DISPLAY DEVICE COMPRISING SAME

CROSS-REFERENCE TO RELATED PATENT APPLICATIONS

This application is a Continuation of U.S. application Ser. No. 17/629,458, filed Jan. 24, 2022, which is a U.S. National Stage Application under 35 U.S.C. § 371 of PCT Application No. PCT/KR2020/009587, filed Jul. 21, 2020, which claims priority to Korean Patent Application Nos. 10-2019-0091609, filed Jul. 29, 2019 and 10-2019-0098883, filed Aug. 13, 2019, whose entire disclosures are hereby incorporated by reference.

TECHNICAL FIELD

Embodiments relate to a display substrate and a display device including the same.

BACKGROUND ART

Recently, there is an increasing demand for a flexible or foldable display device capable of easily carrying various applications and displaying an image on a large screen when being carried.

Such a flexible or foldable display device is folded or partially bent when being carried or stored, and may be implemented with the display unfolded when displaying images. Accordingly, an image display area may be increased, and a user may easily carry the display.

After the flexible or foldable display device is folded or bent, a restoration process of unfolding the flexible display device again may be repeated.

That is, since the flexible or foldable display device repeats folding and unfolding operations, the substrate of the flexible or foldable display device is required to have a certain strength and elasticity, and cracks and deformations should not occur in the substrate during folding and restoring.

Meanwhile, the display substrate constituting the flexible or foldable display device generally uses a metal substrate. Such a metal substrate is processed by a rolling process during manufacturing, and at this time, an irregular waviness may be formed on a surface of the substrate by the rolling process. Such a waviness increases a surface roughness of the substrate, and thus, a curl phenomenon may occur in one area of the substrate while the folding and unfolding operations are repeated.

In particular, when the curl phenomenon occurs in a folding area of the display substrate, the folding area is not planarized, and thus folding defects such as cracks occur in the folding area when the substrate is folded, and there is a problem that folding reliability of the flexible display device is deteriorated.

Therefore, there is a need for a display substrate of a new structure capable of minimizing the waviness and the curl phenomenon of the folding area in the display substrate applied to the flexible or foldable display device.

DISCLOSURE

Technical Problem

An embodiment is directed to providing a display substrate having improved reliability and visibility and a display device including the same.

Technical Solution

A display substrate according to an embodiment relates to a display substrate including a display panel installation area and a bezel area, the display substrate includes: one surface and the other surface opposite to the one surface; a first area defined as a folding area where the one surface area is folded to face each other; and a second area defined as an unfolding area, wherein a groove formed on the one surface or the other surface of the display substrate is formed in the display panel installation area of the first area, and a hole passing through the one surface and the other surface of the display substrate is formed in the bezel area of the first area.

Advantageous Effects

In a display substrate according to an embodiment, patterns having different shapes may be formed depending on an area of the substrate.

In detail, a groove may be formed on an area of the substrate that overlaps a display panel disposed on the substrate, and a hole may be formed on an area of the substrate that does not overlap the display panel.

By forming a groove pattern only on a surface opposite to a surface facing the display panel without forming a pattern on a substrate surface facing the display panel in the area of the substrate that overlaps the display panel disposed on the substrate, it is possible to prevent deterioration of visibility such as spots due to the groove pattern when the display panel and the substrate adhere to each other with an effect of dispersing stress when the substrate is folded.

In addition, by forming a hole pattern in the area that does not overlap the display panel disposed on the substrate, it is possible to prevent bending due to a stress difference of upper and lower portions of the substrate with the effect of dispersing the stress when the substrate is folded.

Therefore, the display substrate according to the embodiment may prevent the deterioration of reliability due to bending and the deterioration of visibility due to the pattern.

In addition, in the substrate according to the embodiment, when forming the holes, an outer area having a high residual stress is formed larger than an inner area having a relatively low residual stress, that is, formed by etching more, so that it is possible to alleviate a stress difference depending on the area in the display substrate.

Therefore, the display substrate according to the embodiment minimizes a warping or bending phenomenon of the display substrate due to a stress difference between a surface layer and an inner layer, thereby improving flatness and reliability of the display substrate.

In addition, in the substrate according to the embodiment, a slimming process for etching the surface layer of the substrate and an etching process for forming a hole in the substrate may be simultaneously performed. In detail, the slimming process for partially etching a surface layer of a metal substrate in order to reduce residual stress of the metal substrate by one laser irradiation and the etching process of a pattern hole for dispersing stress due to folding may be simultaneously performed.

Therefore, in the display substrate according to the embodiment, exposure, development, and etching processes may be omitted by using a photoresist or the like without proceeding with a plurality of processes step by step, thereby improving process efficiency.

In addition, while proceeding the plurality of processes step by step, it is possible to prevent an occurrence of variations in the upper and lower portions of the substrate, whereby the bending phenomenon of the substrate may be prevented, thereby improving the reliability of the display substrate.

DESCRIPTION OF DRAWINGS

FIG. 1 is a perspective view of a flexible display device according to an embodiment.

FIG. 2 is a perspective view of a flexible display device according to another embodiment.

FIG. 3 is a perspective view of a display substrate according to an embodiment.

FIG. 4 is a side view of the display substrate according to the embodiment before folding.

FIG. 5 is a side view of the display substrate according to the embodiment after folding.

FIG. 6 is a top view of the flexible display device according to the embodiment.

FIG. 7 is a cross-sectional view taken along line A-A' of FIG. 6.

FIG. 8 is a cross-sectional view taken along line B-B' of FIG. 6.

FIG. 9 is a cross-sectional view taken along line C-C' of FIG. 6.

FIG. 10 is a top view of a flexible display device according to another embodiment.

FIG. 11 is a cross-sectional view taken along line D-D' of FIG. 10.

FIG. 12 is a cross-sectional view taken along line E-E' of FIG. 10.

FIG. 13 is a cross-sectional view taken along line F-F' of FIG. 10.

FIG. 14 is a cross-sectional view of a hole formed in the display substrate according to the embodiment.

FIG. 15 is an enlarged view of area B in FIG. 14.

FIGS. 16 to 18 are views showing a process of forming the hole of the display substrate according to the embodiment.

FIG. 19 is a view for describing an example in which a display substrate according to an embodiment is applied.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (A, and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a display substrate according to an embodiment will be described with reference to drawings.

FIGS. 1 and 2 are perspective views of a flexible display device according to an embodiment.

Referring to FIG. 1, a flexible display device 1000 according to an embodiment may include a substrate 100 and a display panel 200 disposed above the substrate 100.

The substrate 100 may support the display panel 200. That is, the substrate 100 may be a support substrate supporting the display panel 200.

The substrate 100 may include a material such as metal. For example, the substrate 100 may include metal, metal alloy, plastic, a composite material (e.g., carbon fiber reinforced plastic, a magnetic or conductive material, a glass fiber reinforced material, etc.), ceramic, sapphire, glass, and the like.

The substrate 100 may be flexible. That is, the substrate 100 may be folded or bent in one direction. That is, the substrate 100 may be a display substrate applied to a flexible or foldable display device.

The substrate 100 may include at least two areas. In detail, the substrate 100 may include a first area 1A and a second area 2A.

The first area 1A may be defined as an area where the substrate 100 is folded. That is, the first area 1A may be a folding area.

In addition, the second area 2A may be defined as an area where the substrate 100 is not folded. That is, the second area 2A may be an unfolding area.

The first area 1A and the second area 2A will be described in detail below.

The substrate 100 may include a display panel installation area AA and a bezel area UA. The display panel installation area AA may be defined as an area where the display panel 200 is disposed, and the bezel area UA may be defined as an area surrounding the display panel installation area AA as an area where the display panel 200 is not disposed.

The substrate 100 may have a certain thickness. In detail, the substrate 100 may have a thickness of about 0.2 mm or less. In more detail, the substrate 100 may have a thickness of about 0.05 mm to 0.2 mm.

When the thickness of the substrate 100 exceeds about 0.2 mm, cracks may occur due to the thickness of the substrate 100 when folding the display device, and when the thickness of the substrate 100 is less than about 0.05 mm, strength of the substrate 100 is lowered, and thus the role of the supporting substrate may be difficult.

The display panel 200 may be disposed above the substrate 100. In detail, the display panel 200 may be disposed on the display panel installation area AA of the substrate 100.

The display panel 200 may include a plurality of pixels including a switching thin film transistor, a driving thin film transistor, a power storage device, and an organic light-emitting diode (OLED). In case of the OLED, deposition may be performed at a relatively low temperature, and the OLED may be mainly applied to a flexible display device for reasons such as low power and high luminance. Here, a pixel refers to a minimum unit for displaying an image, and the display panel displays an image through a plurality of pixels.

The display panel may include a substrate, a gate line disposed on the substrate, a data line isolated from the gate line, and a common power line. In general, one pixel may be defined by the gate line, the data line, and the common power line as a boundary.

The substrate may include a material having flexible properties such as a plastic film, and the display panel 200 may be implemented by disposing an organic light-emitting diode and a pixel circuit on a flexible film.

Referring to FIG. 2, the flexible display device 1000 according to the embodiment may further include a touch panel 300.

The touch panel 300 may be disposed above the display panel 200. In detail, the touch panel 300 may be disposed above the display panel 200 on an area corresponding to the display panel installation area AA of the substrate 100.

The touch panel 300 may implement a touch function in the flexible display device, and the touch panel may be omitted in a flexible display device that simply displays an image without the touch function.

The touch panel 300 may include a substrate and a touch electrode disposed on the substrate. The touch electrode may sense a position of an input device that is touched on the flexible display device using a capacitance type or a resistive film type.

The substrate of the touch panel 300 may include a material having flexible properties such as a plastic film, and the touch panel 300 may be implemented by disposing the touch electrode on the flexible film.

Meanwhile, although not shown in the drawings, a cover window protecting the flexible display device may be additionally disposed above the touch panel 300 or above the display panel 200 (when the touch panel is omitted).

Meanwhile, the substrate 100, the display panel 200, and the touch panel 300 may be adhered to each other through an adhesive layer or the like. In this case, when the substrate 100 and the display panel 200 are adhered to each other, the adhesive layer may not be disposed in the first area, that is, the folding area, of the substrate 100, and the adhesive layer may be disposed in only the second area, that is, the unfolding area to be adhered to each other.

Accordingly, it is possible to easily fold the flexible display device. Therefore, when a surface flatness of the folding area is lowered and a curvature of the folding area, that is, the flatness is increased, the folding area is damaged during folding, and thus the folding reliability may be deteriorated.

Meanwhile, when the substrate 100 and the display panel 200 are adhered to each other, non-uniform lighting of the display panel and/or spots according to a pattern are generated due to patterns formed on the substrate 100, and thus visibility may be reduced for users looking from the outside.

The substrate 100 of the flexible display device described below relates to a structure capable of compensating for the above-mentioned disadvantages due to such a pattern of the substrate.

As described above, the flexible display device includes the substrate 100.

Referring to FIG. 3, the substrate 100 may be bent in one direction.

In detail, the substrate 100 may include one surface 1S and the other surface 2S opposite to the one surface 1S. The one surface 1S of the substrate 100 may be defined as a surface facing the display panel 200, and the other surface 2S of the substrate 100 may be defined as a surface opposite to the one surface 1S. That is, the display panel 200 may be disposed on the one surface 1S of the substrate 100.

In the substrate 100, the one surface 1S or the other surface 2S may be bent to face each other.

In the following description, as shown in FIG. 3, it will be mainly described that the one surfaces 1S are bent in a direction facing each other in the substrate 100.

As described above, the first area 1A and the second area 2A may be defined in the substrate 100. The first area 1A and the second area 2A may be areas defined when the one surfaces 1S are bent in the direction facing each other in the substrate 100.

In detail, the substrate 100 is bent in one direction, and the substrate 100 may be divided into the first area 1A which is a folded area (folding area) and the second area 2A which is an unfolded area (unfolding area).

Referring to FIG. 4 and FIG. 5, the substrate 100 may include the first area 1A that is an area where the substrate 100 is bent. The substrate 100 may include the second area 2A that is not bent and is disposed adjacent to the first area 1A.

For example, the second area 2A may be formed on the left side and the right side of the first area 1A based on the direction in which the substrate 100 is bent. That is, the second area 2A may be disposed at both ends of the first area 1A. That is, the first area 1A may be disposed between the second areas 2A.

The first area 1A and the second area 2A may be formed on the same substrate 100. That is, the first area 1A and the second area 2A may be formed integrally with each other without being separated on the same substrate 100.

Sizes of the first area 1A and the second area 2A may be different from each other. In detail, the size of the second area 2A may be larger than the size of the first area 1A.

In the drawings, it is illustrated that the first area 1A is positioned in a central portion of the substrate 100, but the embodiment is not limited thereto. That is, the first area 1A may be positioned in one end and an end area of the substrate 100. That is, the first area 1A may be positioned at one end and the end area of the substrate 100 such that the size of the second area 2A is asymmetric.

FIG. 5 is a side view of the display substrate after the substrate is folded.

Referring to FIG. 5, the substrate 100 may be folded in one direction around a folding axis. In detail, the one surface 1S may be folded in a direction facing each other along the folding axis.

As the substrate 100 is folded in one direction, the first area 1A and the second area 2A may be formed on the substrate 100. That is, the folding area formed by folding the substrate 100 in one direction and the unfolding area positioned at both ends of the folding area may be formed in the substrate 100.

The folding area may be defined as an area where a curvature R is formed, and the unfolded area may be defined as an area where the curvature R is not formed or the curvature is close to zero.

Referring to FIGS. 4 and 5, the substrate 100 may be folded in one direction to be formed in an order of the unfolding area, the folding area, and the unfolding area.

A plurality of holes may be formed in at least one of the first area 1A and the second area 2A to disperse stress generated when the substrate 100 is folded.

Hereinafter, holes and grooves formed in a display substrate according to an embodiment will be described with reference to FIGS. 6 to 9.

FIG. 6 is a top view of one surface of the display substrate according to the embodiment. That is, FIG. 6 is a top view of one surface 1S of the substrate that is a folding inner surface when the substrate 100 is folded.

Referring to FIGS. 6 and 7, a plurality of grooves G passing through the substrate 100 or holes H formed in the substrate 100 may be formed in the substrate 100.

In detail, the plurality of grooves G passing through the substrate 100 or the holes H formed in the substrate 100 may be formed in the first area 1A of the substrate 100. That is, the plurality of grooves G passing through the substrate 100 or the holes H formed in the substrate 100 may be formed in the folding area of the substrate 100.

Meanwhile, FIG. 6 illustrates only four grooves in a row direction and nine grooves in a column direction that are formed in the first area 1A, but this is for convenience of description, and more or fewer grooves may be formed in the first area 1A in the row direction or the column direction, which may be equally applied to following cross-sectional views.

The plurality of grooves G or holes H formed in the first area 1A serves to disperse stress generated when the first area is folded. In detail, deformation and damage according to the stress may occur in the first area 1A of the substrate due to compressive stress generated when the substrate 100 is folded.

That is, it is possible to reduce the magnitude of the compressive stress generated in the first area 1A when the first area 1A is folded by forming the grooves G or holes H in the first area 1A to reduce a thickness or a remaining area of the first area 1A.

Therefore, it is possible to prevent the stress from being concentrated on a specific area of the first area 1A by forming the plurality of grooves G or holes H in the first area 1A. Therefore, it is possible to prevent the substrate from being damaged due to the compressive stress generated when the substrate 100 is folded.

The grooves G or holes H may be formed in a regular pattern in the first area 1A. Alternatively, the grooves G or holes H may be formed in an irregular pattern in the first area 1A.

The grooves G or holes H may be formed to have a curved surface. In detail, the grooves G or holes H may be formed in a shape having a curved surface such as an elliptical shape, a hemispherical shape, a circular shape, or the like. As an example, the grooves G or holes H may be formed in an elliptical shape having a major axis in a width direction of the substrate 100 and a minor axis in a length direction of the substrate 100.

However, the embodiment is not limited thereto, and the grooves G or holes H may be formed in a polygonal shape such as a triangle, a square, or the like.

Meanwhile, the first area 1A and the second area 2A may be classified by the presence or absence of a hinge portion. That is, the folding area and the unfolding area may be classified by the presence or absence of the hinge portion.

In detail, a plurality of hinge portions may be formed in the first area 1A, and the hinge portions may not be formed in the second area 2A.

That is, the folding area may be defined as an area where a hinge portion HN is formed. That is, the folding area may include the hinge portion HN.

The hinge portion HN may be defined as a point at which folding starts in the substrate 100. That is, the substrate may start folding from the hinge portions of both ends among the plurality of hinge portions.

The hinge portion HN may include the plurality of hinge portions according to a folding shape of the substrate 100. The hinge portions HN may be formed at both ends of the substrate 100 overlapping a column direction in which the grooves G or holes H are formed based on a unidirectional length in a width direction of the substrate 100.

Accordingly, when the substrate 100 is folded by the hinge portion HN, the folding area may be easily folded.

The hinge portion HN may be formed by passing through one surface and the other surface of a unidirectional area among end areas of the substrate 100. That is, the hinge portion HN may be defined as a hole formed by passing through both end areas in the unidirectional direction among the end areas of the substrate 100.

A shape of the hinge portion HN may be the same as or different from a shape and size of the grooves G or holes H. For example, the hole may be formed to have a curved surface. In detail, the hinge portion HN may be formed in a shape having a curved surface such as an elliptical shape, a hemispherical shape, or a circular shape.

However, the embodiment is not limited thereto, and of course, the hinge portion may be formed in a polygonal shape such as a triangular shape or a quadrangular shape, or an elliptical shape.

Meanwhile, the substrate 100 may have a different pattern shape depending on an area thereof. In detail, the grooves G may be formed in the display panel installation area AA of the substrate 100, and the holes H may be formed in the bezel area UA.

Referring to FIGS. 6 to 8, a groove G may be formed in the display panel installation area AA. In detail, the plurality of grooves G spaced apart from each other may be formed in the display panel installation area AA. The groove G may be formed passing through any one of both surfaces of the substrate 100. In detail, the groove G may be formed passing through one surface 1S or the other surface 2S of the substrate 100. In detail, the groove G may be formed passing through the other surface 2S of the substrate 100. That is, the groove G may pass through the other surface 2S that is an opposite surface of a surface in which the substrate 100 and the display panel face each other, is not the one surface 1S in which the substrate 100 and the display panel face each other and may be formed to extend in a direction of the one surface 1S. Accordingly, the grooves G may be formed in an area overlapping the display panel.

Accordingly, in the substrate 100, a hole pattern or a groove pattern may not be formed on the one surface 1S facing the display panel 200, and a groove-shaped pattern may be formed only on the other surface 2S of the substrate.

Accordingly, since the pattern is not formed in a contact area between the substrate 100 and the display panel 200, it is possible to prevent the deterioration of visibility due to the pattern. In detail, when the hole pattern or the groove pattern is formed in the substrate 100 on a surface in which the display panel 200 and the substrate 100 are in contact with each other, the pattern may cause a non-uniform phenomenon of light emitted from the display panel, and accordingly, there is a problem that it is visually recognized as spots from the outside due to the non-uniformity of light.

Therefore, in the display device according to the embodiment, since the groove pattern is formed only on the other surface 2S of the substrate 100, and the pattern is not formed on the one surface 1S of the substrate 100, that is, the surface in contact with the display panel 200, it is possible to prevent a non-uniform distribution of light emitted from the display panel with a release effect of stress due to folding, thereby improving both reliability and visibility of the display device.

Meanwhile, the groove G formed in the display panel installation area AA of the substrate may be formed to have a certain depth. In detail, the groove G may be formed to a depth less than 0.5 times the thickness of the substrate. When the depth of the groove G exceeds 0.5 times the thickness of the substrate, the groove is recognized as a pattern on the one surface IS of the substrate 100 due to the depth of the groove, so that the uniformity of the light emitted from the display panel may be reduced, and the overall strength of the substrate may be reduced, thereby deteriorating the reliability of the display device.

In addition, the substrate 100 may be surface-treated. In detail, the substrate 100 may be surface-treated on the one surface 1S and the other surface 2S of the substrate 100 before forming the hole or the groove. That is, the one surface 1S and the other surface 2S of the substrate 100 may be etched by a certain thickness through a slimming process before forming the hole or the groove.

The substrate 100 may have different surface and internal stresses. In detail, the substrate 100 may include a metal including at least one or more of iron (Fe), nickel (Ni), and chromium (Cr). In detail, the substrate 100 may include stainless steel.

The substrate 100 may undergo a cold rolling process for rigidity, and a surface stress of the substrate 100 may be greater than an internal stress of the substrate 100 by the cold rolling process.

Accordingly, when the groove pattern is formed on only one surface of the substrate in the display panel installation area without surface-treating the substrate, a stress difference between one surface and the other surface is generated, so that the substrate may be bent in a direction in which the groove is formed.

Therefore, by etching the one surface and the other surface of the substrate 100 in a certain thickness or more through the slimming process using etching or heat before forming the groove pattern or the hole pattern in the substrate 100, the stress difference between the surface and the inside is released, so that it is possible to prevent a bending phenomenon occurring when the groove pattern is formed on only one surface of the substrate in the display panel installation area.

Meanwhile, referring to FIGS. 6, 7 and 9, the hole H may be formed in the bezel area UA of the substrate 100. That is, the holes H may be formed in an area that does not overlap the display panel 200.

In detail, a plurality of holes H disposed to be spaced apart from each other may be formed in the bezel area UA. The hole H may be formed passing through the substrate 100. In detail, the hole H may be formed passing through one surface 1S and the other surface 2S of the substrate 100.

The hole H may be formed passing through the one surface 1S disposed inside a folding direction and the other surface 2S disposed outside the folding direction.

The plurality of holes formed in the bezel area UA serve to disperse a stress generated when the first area is folded. In detail, deformation and damage due to the stress may occur in the first area 1A of the substrate due to the compressive stress generated when the substrate 100 is folded.

Therefore, it is possible to prevent the stress from being concentrated on a specific area of the first area 1A by forming the hole in the bezel area UA. Therefore, it is possible to prevent the substrate from being damaged due to the compressive stress generated when the substrate 100 is folded.

The holes H may be formed in a regular pattern in the bezel area UA. Alternatively, the holes H may be formed in an irregular pattern in the bezel area UA.

The hole H may be formed to have a curved surface. In detail, the hole H may be formed in a shape having a curved surface such as an elliptical shape, a hemispherical shape, a circular shape, or the like.

However, the embodiment is not limited thereto, and of course, the hole H may be formed in a polygonal shape such as a triangle, a square, or the like.

In the display substrate according to the embodiment, patterns having different shapes may be formed depending on an area of the substrate.

In detail, the groove may be formed on an area of the substrate that overlaps the display panel disposed on the substrate, and the hole may be formed on an area of the substrate that does not overlap the display panel.

By forming a groove pattern only on a surface opposite to a surface facing the display panel without forming a pattern on a substrate surface facing the display panel in the area of the substrate that overlaps the display panel disposed on the substrate, it is possible to prevent deterioration of visibility such as spots due to the groove pattern when the display panel and the substrate adhere to each other with an effect of dispersing stress when the substrate is folded.

In addition, by forming a hole pattern in the area that does not overlap the display panel disposed on the substrate, it is possible to prevent bending due to a stress difference of upper and lower portions of the substrate with the effect of dispersing the stress when the substrate is folded.

Therefore, the display substrate according to the embodiment may prevent the deterioration of reliability due to bending and the deterioration of visibility due to the pattern.

Meanwhile, in the display substrate according to the embodiment, the hole may be formed in the unfolding area.

Referring to FIGS. 10 to 13, grooves and holes may be formed in the second area of the substrate 100 in the display substrate.

In detail, the substrate 100 includes the first area 1A and the second area 2A, and the grooves and holes may also be formed in the first area 1A and the second area 2A.

Since the grooves and holes formed in the first area 1A are the same as those of the above-described embodiment, the following description will be omitted. That is, the grooves and holes of the embodiment described with reference to FIGS. 6 to 9 may be combined with other embodiments as shown in FIGS. 10 to 13 below.

A plurality of grooves and holes spaced apart from each other may be formed in the second area 2A.

In detail, referring to FIGS. 10 to 12, the grooves may be formed in the display panel installation area AA of the substrate among the second areas 2A, and the holes may be formed in the bezel area UA of the substrate among the second areas 2A.

That is, in the display substrate according to FIGS. 10 to 13, the grooves and holes may also be formed in a non-bent area other than a bent area.

That is, grooves and holes may be formed in the entire area of the substrate.

Accordingly, it is possible to prevent the display substrate from being bent or distorted by alleviating a difference between the deformation of the first area due to heat and the deformation of the second area due to heat.

In detail, when the difference in deformation due to heat in the first area and the second area is too large, the display substrate may be bent or distorted, and accordingly, cracks may occur in the substrate in a boundary area between the first area and the second area.

Accordingly, the display substrate according to the embodiment may prevent damage to the display substrate due to thermal deformation by forming the holes in the second area as well.

In addition, when the holes or grooves s are formed in both the first and second areas and the substrate 100 and the display panel 200 are adhered to each other, it is possible to improve adhesion characteristics by preventing a step due to the formation of the holes or grooves.

Hereinafter, the hole formed in the display substrate described above and a forming process thereof will be described with reference to FIGS. 14 to 18.

FIG. 14 is a cross-sectional view of the hole formed in the display substrate.

The hole H may have different sizes depending on each area. In detail, the hole H may have different inner diameter sizes depending on each area. That is, the etching degree of the hole H may be different depending on each area.

Referring to FIG. 15, the substrate 100 may include a plurality of areas. In detail, the substrate 100 may be defined as an outer area OA extending in a depth direction of the hole H and the inside of the substrate 100 and may include an inner area IA between the outer areas OA.

That is, the substrate 100 may be defined as the outer area OA extending in the depth direction from the surface of the substrate 100 and the inside of the substrate 100 and may include the inner area IA between the outer areas OA.

Accordingly, the hole H may include the outer area extending in the depth direction from the one surface and the other surface and the inner area between the outer areas.

The hole H may be formed to have different sizes in the outer area OA and the inner area IA. That is, the hole H may have different inner diameter sizes in the outer area OA and the inner area IA.

In detail, a size of a first inner diameter IR1 in the outer area OA of the hole H may be greater than a size of a second inner diameter IR2 in the inner area OA.

In addition, an outer diameter OR of the hole H may be defined in the outer area OA, and the outer diameter OR may be greater than those of the first inner diameter IR1 and the second inner diameter IR2.

The size of the hole H may be formed to be gradually changed in the outer area OA. In detail, the size of the first inner diameter IR1 of the hole H may be formed so as to gradually decrease while extending in a direction of the inner area IA in the outer area OA. That is, the size of the first inner diameter IR1 of the hole H may be formed so as to gradually decrease as a distance from the outer diameter OR increases in the outer area OA.

That is, the hole H may be formed as a curved surface having a certain curvature in the outer area OA, and the size of the first inner diameter IR1 may gradually decrease while extending in the direction of the inner area IA from the outer diameter OR in the outer area OA.

Accordingly, the hole H may be formed while the outer area OA of the substrate 100 is etched more than the inner area IA.

In the case of the substrate 100, a residual stress on the surface of the substrate 100 may be greater than an internal residual stress while undergoing a process such as cold rolling before forming a hole pattern or the like.

Accordingly, in the substrate 100 according to the embodiment, when forming the holes, the outer area having a high residual stress is formed larger than the inner area having a relatively low residual stress, that is, formed by etching more, so that, it is possible to alleviate the stress difference depending on the area in the substrate 100.

Therefore, the display substrate according to the embodiment minimizes a warping or bending phenomenon of the display substrate due to a stress difference between a surface layer and an inner layer, thereby improving flatness and reliability of the display substrate.

FIGS. 16 to 18 are views showing a process of forming the hole formed in the display substrate according to the embodiment described above.

Referring to FIG. 16, first, a metal substrate 100' is prepared.

The metal substrate 100' may include stainless steel or the like. A surface of one surface and the other surface of the metal substrate 100' may be subjected to a cold rolling process.

Referring to FIG. 17, a pattern may be formed on the metal substrate 100'.

In detail, a laser may be irradiated on one surface 1S and the other surface 2S of the metal substrate 100'. That is, the metal substrate 100' may be partially etched by irradiating the laser to a part of the areas of one surface 1S and the other surface 2S of the metal substrate 100'.

Accordingly, the metal substrate 100' may be partially half-etched, and a plurality of grooves formed on the one surface 1S and the other surface 2S of the metal substrate 100' may be formed in the metal substrate 100'.

The plurality of grooves formed on the one surface 1S and the other surface 2S of the metal substrate 100' may be formed to overlap each other.

Subsequently, referring to FIG. 18, a hole may be formed in the metal substrate 100'.

In detail, the laser may be irradiated on the one surface 1S and the other surface 2S of the metal substrate 100'. That is, the metal substrate 100' may be etched as a whole by irradiating the laser on the entire areas of one surface 1S and the other surface 2S of the metal substrate 100'. Accordingly, a thickness of the metal substrate 100' may be reduced from a first thickness T1 to a second thickness T2.

Accordingly, in the area of the metal substrate that has already been half-etched in the metal substrate 100', the grooves on one side and the other side may pass through to form holes. In addition, the metal substrate 100' may be etched in an area not subjected to half-etching.

That is, in the metal substrate 100', a slimming process for etching the surface layer of the metal substrate and an etching process for forming a hole in the metal substrate 100' may be simultaneously performed. In detail, the slimming process for partially etching a surface layer of a metal substrate in order to reduce residual stress of the metal substrate by one laser irradiation and the etching process of a pattern hole for dispersing stress due to folding may be simultaneously performed.

Therefore, in the display substrate according to the embodiment, exposure, development, and etching processes may be omitted by using a photoresist or the like without proceeding with a plurality of processes step by step, thereby improving process efficiency.

In addition, while proceeding the plurality of processes step by step, it is possible to prevent an occurrence of variations in the upper and lower portions of the substrate, whereby the bending phenomenon of the substrate may be prevented, thereby improving the reliability of the display substrate.

Meanwhile, the residual stress described above may be measured as follows, and a residual stress rate of the display substrate according to the embodiment may be 1 or less. In detail, the residual stress rate of the display substrate according to the embodiment may be 0.1 or less. In more detail, the residual stress rate of the display substrate according to the embodiment may be 0.06 or less. In more detail. The residual stress rate of the display substrate according to the embodiment may be 0.03 or less.

Residual Stress Measurement Method

An arbitrary sample metal plate having a size of 200 mm*30 mm (width*length) was taken from a metal substrate. Subsequently, an area of 150 mm*30 mm (horizontal*vertical) excluding 25 mm from one end of the sample metal plate in the horizontal direction was etched so as to have a thickness of 30% to 70% of a thickness of the metal substrate. Then, after mounting the etched sample metal plate on a horizontal table, the residual stress rate was measured through the following equation.

$$\text{Residual stress rate}=H/L \qquad \text{[Equation]}$$

(H: a maximum height at which an etched area of the sample metal plate is bent from the upper surface of the horizontal table, and L: a length in the horizontal direction of the sample metal plate on which the etched area is formed)

FIG. 19 is a view for describing an example in which a display substrate according to embodiments is applied.

Referring to FIG. 19, the display substrate according to the embodiments may be applied to a flexible display device that displays a display.

For example, the display substrate according to the embodiments may be applied to a flexible display device such as a mobile phone or a tablet.

Such a display substrate may be applied to flexible display devices such as a mobile phone, a tablet, and the like that are flexible, bent or folded.

The display substrate is applied to the flexible display devices such as the mobile phone, the tablet, and the like that are flexible, bent or folded and may improve the reliability of the flexible display device by improving the folding reliability in the display device that is repeatedly folded or restored.

The characteristics, structures, effects, and the like described in the above embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, the above description of the embodiments is merely examples and does not limit the present invention. It would be apparent to those of ordinary skill in the art that the present invention may be easily embodied in many different forms without changing the technical idea or essential features thereof. For example, elements of the exemplary embodiments described herein may be modified and realized. Also, it should be construed that differences related to such changes and applications are included in the scope of the present invention defined in the appended claims.

The invention claimed is:

1. A display substrate foldable based on a folding axis, the display substrate comprising:
- a first surface and a second surface opposite to the first surface;
- a first region positioned closer to the folding axis and having a first opening pattern; and
- a second region positioned farther from the folding axis than the first region and having a second opening pattern,
- wherein the first opening pattern includes a first hole passing through the first surface and the second surface,
- wherein the first hole includes an outer region positioned closer to the first surface or the second surface, and an inner region positioned farther from the first surface or the second surface than the outer region,
- wherein a first diameter of the first hole in the outer region is greater than a second diameter of the first hole in the inner region,
- wherein an inner surface of the first hole includes a single curved surface continuously extending in a depth direction of the display substrate,
- wherein the single curved surface is a convex surface convex toward an inside of the first hole, and
- wherein a first end of the single curved surface is connected to the first surface and a second end of the single curved surface opposite to the first end is connected to the second surface.

2. The display substrate of claim 1,
- wherein the outer region includes a first outer region positioned closer to the first surface, and a second outer region positioned closer to the second surface,
- wherein the inner region is positioned between the first outer region and the second outer region,
- wherein a first-first diameter of the first hole in the first outer region is greater than the second diameter, and
- wherein a first-second diameter of the first hole in the second outer region is greater than the second diameter.

3. The display substrate of claim 2,
- wherein the first outer region is provided between the first surface and the inner region to extend in a depth direction of the display substrate, and
- wherein the second outer region is provided between the second surface and the inner region to extend in the depth direction of the display substrate.

4. The display substrate of claim 2, wherein a third diameter of the first hole at the first surface is greater than the first-first diameter.

5. The display substrate of claim 2, wherein a fourth diameter of the first hole at the second surface is greater than the first-second diameter.

6. The display substrate of claim 1, wherein in a vertical cross-section of the first hole, the single curved surface has a predetermined radius of curvature.

7. The display substrate of claim 6, wherein the predetermined radius of curvature is constant along the single curved surface.

8. The display substrate of claim 1, wherein the first hole includes a plurality of hole pattern spaced apart in a first direction corresponding to the folding axis and a second direction perpendicular to the first direction.

9. The display substrate of claim 1, wherein the second opening pattern includes a second hole passing through the first surface and the second surface, and wherein the second hole includes a second outer region and a second inner region.

10. The display substrate of claim 1, wherein the display substrate includes a first side and a second side facing in a first direction in which the folding axis extends, and wherein the first region further includes a hinge portion connected to the first side or the second side.

11. The display substrate of claim 1, wherein the second opening pattern includes a groove having a concave cross-sectional profile at the first surface or the second surface.

12. The display substrate of claim 11, wherein the groove includes a plurality of groove pattern spaced apart in a second direction perpendicular to a first direction corresponding to the folding axis.

13. The display substrate of claim 12, wherein a width of the hole pattern in the second direction is same as a width of the groove pattern.

14. The display substrate of claim 12, wherein a spacing in the second direction between adjacent hole patterns is same as a spacing in the second direction between adjacent groove patterns.

15. A display device comprising:

a display substrate foldable based on a folding axis; and a display panel disposed on the display substrate, wherein the display substrate includes:

a first surface and a second surface opposite to the first surface;

a first region positioned closer to the folding axis and having a first opening pattern; and a second region positioned farther from the folding axis than the first region and having a second opening pattern, wherein the first opening pattern includes a first hole passing through the first surface and the second surface, wherein the first hole includes an outer region positioned closer to the first surface or the second surface, and an inner region positioned farther from the first surface or the second surface than the outer region, wherein a first diameter of the first hole in the outer region is greater than a second diameter of the first hole in the inner region, wherein an inner surface of the first hole includes a single curved surface continuously extending in a depth direction of the display substrate, wherein the single curved surface is a convex surface convex toward an inside of the first hole, and wherein a first end of the single curved surface is connected to the first surface and a second end of the single curved surface opposite to the first end is connected to the second surface.

16. The display device of claim 15, wherein the outer region includes a first outer region positioned closer to the first surface, and a second outer region positioned closer to the second surface, wherein the inner region is positioned between the first outer region and the second outer region, wherein a first-first diameter of the first hole in the first outer region is greater than the second diameter, wherein a first-second diameter of the first hole in the second outer region is greater than the second diameter, wherein the first outer region is provided between the first surface and the inner region to extend in a depth direction of the display substrate, and wherein the second outer region is provided between the second surface and the inner region to extend in the depth direction of the display substrate.

17. The display device of claim 16, wherein a third diameter of the first hole at the first surface is greater than the first-first diameter, and wherein a fourth diameter of the first hole at the second surface is greater than the first-second diameter.

18. The display device of claim 17, wherein in a vertical cross-section of the first hole the single curved surface has a predetermined radius of curvature, and wherein the predetermined radius of curvature is constant along the single curved surface.

19. The display device of claim 18, wherein the second opening pattern includes a groove having a concave cross-sectional profile at the first surface or the second surface, and wherein the groove includes a plurality of groove pattern spaced apart in a second direction perpendicular to a first direction corresponding to the folding axis.

* * * * *